(12) United States Patent
Oda

(10) Patent No.: US 6,853,255 B2
(45) Date of Patent: Feb. 8, 2005

(54) AFC CIRCUIT COMPENSATING AN ERROR IN OSCILLATION FREQUENCY

(75) Inventor: Toshiyuki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/166,769

(22) Filed: Jun. 12, 2002

(65) Prior Publication Data

US 2002/0190803 A1 Dec. 19, 2002

(30) Foreign Application Priority Data

Jun. 19, 2001 (JP) .......................... 2001-184242

(51) Int. Cl.$^7$ ................................ H03L 7/00
(52) U.S. Cl. ......................... 331/17; 331/18; 331/1 A; 375/344
(58) Field of Search ................ 331/1 R, 15, 16, 331/18, 1 A; 375/344, 345, 329–330, 327; 455/205, 208, 255

(56) References Cited

U.S. PATENT DOCUMENTS

| | | | | |
|---|---|---|---|---|
| 5,949,830 A | * | 9/1999 | Nakanishi | 375/334 |
| 5,970,105 A | | 10/1999 | Dacus | 375/344 |
| 6,160,838 A | * | 12/2000 | Shinohara et al. | 375/130 |
| 6,501,730 B1 | * | 12/2002 | Katsumoto | 370/208 |
| 2002/0177458 A1 | | 11/2002 | Hokao | |

FOREIGN PATENT DOCUMENTS

| | | |
|---|---|---|
| EP | 1 217 738 A2 | 6/2002 |
| GB | 2 213 663 A | 8/1989 |
| GB | 2 314 981 A | 1/1998 |
| JP | 63-224409 A | 9/1988 |
| JP | 2002-94592 A | 3/2000 |
| JP | 2002-190765 A2 | 7/2002 |

* cited by examiner

Primary Examiner—Minh Nguyen
(74) Attorney, Agent, or Firm—Foley & Lardner LLP

(57) ABSTRACT

An AFC circuit compensates for an error of the oscillation frequency of a detecting oscillator based on a detection signal from a detector circuit. The detector circuit generates the detection signal at a timing tied to the oscillation frequency of said detecting oscillator. The AFC circuit has a frequency error determining circuit; a reference oscillator, a frequency error/control voltage conversion circuit; a PLL (phase lock loop) circuit; and a detecting frequency computing circuit. The reference oscillator is connected to provide an oscillator input to said PLL, and the PLL is connected to provide a control voltage to said detecting oscillator. The detecting oscillator is responsive to the control voltage for controlling the oscillation frequency thereof. The AFC circuit controls the oscillation frequency of the detecting oscillator based on the frequency error value so as to vary the oscillation frequency used as a sampling frequency of the detector circuit.

7 Claims, 5 Drawing Sheets

(a) TIME DIVISION MULTIPLEXING (b) CODE MULTIPLEXING (a) SYMBOL POINT WHEN FREQUENCY ERROR IS LARGE (b) WHEN CLOCK RATE IS DOUBLED

US 6,853,255 B2

AFC CIRCUIT COMPENSATING AN ERROR IN OSCILLATION FREQUENCY

BACKGROUND OF THE INVENTION

This application claims benefit of Japanese Patent Application No. 2001-184242 filed on Jun. 19, 2001, the contents of which are incorporated by the reference.

The present invention relates to AFC (automatic frequency control) circuit.

Heretofore, in digital demodulators of radio receiver systems, AFC circuits for frequency pull-in are well known in the art.

In the prior art AFC circuit, when detecting synchronization data with a fixed sampling frequency with a phase error near 180°, it become impossible to determine whether the frequency is lagging behind or leading, and this point is a pull-in limit point.

As a measure to cope with this, it is conceivable to provide a highly accurate reference oscillator. The provision of such a high accuracy reference oscillator, however, leads to a problem of difficulty in reduction of the size and price of the whole system.

SUMMARY OF THE INVENTION

The present invention was made in view of the above background, and its object is to provide an AFC circuit capable of increasing the pull-in frequency range and not requiring a high accuracy of the reference oscillator for enabling reduction in the size and cost of the whole system.

According to an aspect of the present invention, there is provided an AFC circuit for compensating for an error of the oscillation frequency of a detecting oscillator based on a detection signal from a detector circuit for detecting a received signal, wherein a control device for computing a frequency error based on the detection signal and controlling the oscillation frequency of the detecting oscillator based on the computed frequency error is provided to vary a sampling frequency inputted to the detector circuit based on the computed frequency error value.

The received signal is modulated in an orthogonal system capable of performing development to an I-Q coordinate plane, the frequency error being computed from the amplitudes of I and Q signals. The oscillation frequency of the detecting oscillator is capable of being controlled based on a control voltage inputted to the detecting oscillator. The detector circuit can double the detection rate by switching the detection by only either the rising or falling edge of the input clock over to the detection by both the edges. The rate of control of the error of the oscillation frequency for the detecting oscillator is capable of being set as desired by a user. The frequency error threshold can be set as desired by a user by determining whether or not to change the sampling frequency by checking whether the frequency error is greater than a predetermined frequency error threshold. For controlling the detecting oscillator a frequency transition time (i.e., clock time) is preliminarily stored, and no pull-in control is made during the transition.

According to another aspect of the present invention, there is provided an AFC method for compensating for an error of the oscillation frequency of a detecting oscillator based on a detection signal from a detector circuit for detecting a received signal, comprising steps of: computing a frequency error based on the detection signal; and controlling the oscillation frequency of the detecting oscillator based on the computed frequency error to vary sampling frequency inputted to the detector circuit based on the computed frequency error value.

Other objects and features will be clarified from the following description with reference to attached drawings.

PREFERRED EMBODIMENTS OF THE INVENTION

Preferred embodiments of the present invention will now be described with reference to the drawings.

Figure 1:
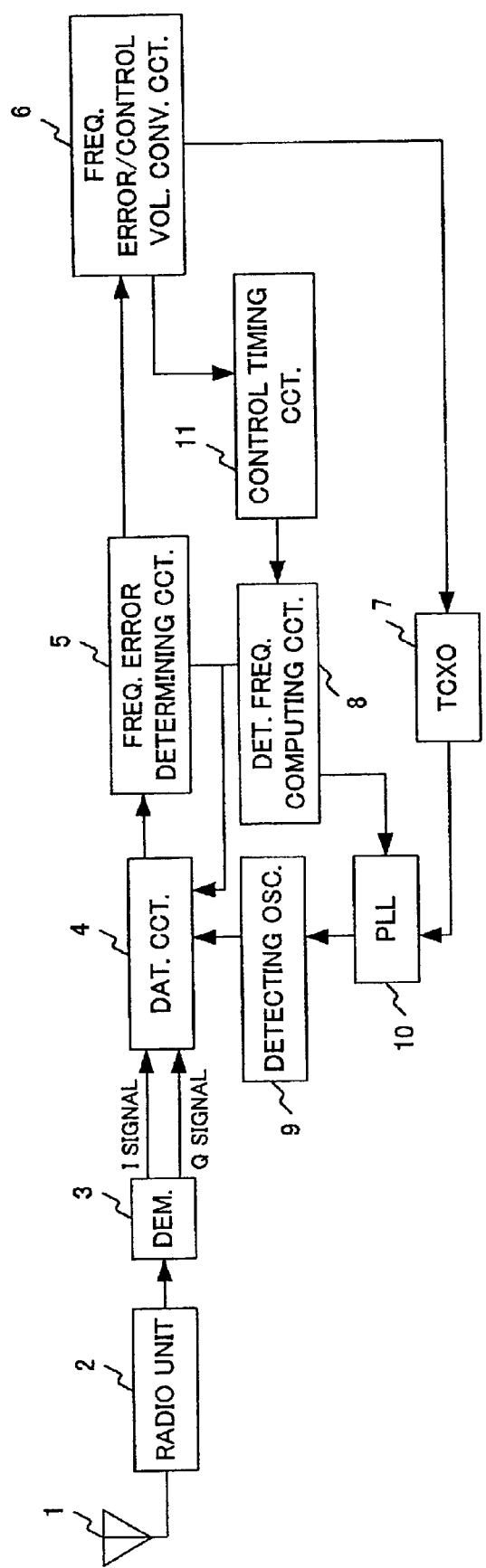
FIG. 1 is a block diagram schematically showing the construction of a radio receiver system in an embodiment of the AFC circuit according to the present invention.

FIG. 1 is a block diagram schematically showing the construction of a radio receiver system in an embodiment of the AFC circuit according to the present invention. In the following description of the embodiment, it is assumed that the radio receiver system is a mobile station system in mobile communication.

As shown in FIG. 1, the mobile station system in this embodiment comprises an antenna 1 for receiving signal from a base station, a radio unit 2, a demodulator 3, a detector circuit 4, a frequency error determination circuit 5, a frequency error/control voltage conversion circuit 6 for generating a control voltage for a reference oscillator (TCXO) 7 based on a frequency error, the reference oscillator 7, a detection frequency computing circuit 8 for detecting control data for a PLL circuit 10 by computing the detection frequency from the frequency error, a detecting oscillator 9, the PLL circuit 10 and a control timing circuit 11.

The operation of the embodiment will now be described. For AFC operation, known data for synchronization is transmitted from a base station and is demodulated in the mobile station system for compensating for a reference signal deviation in the mobile system. Examples of slot configuration of the known data will now be described with reference to the PDC and CDMA systems.

Figure 2:
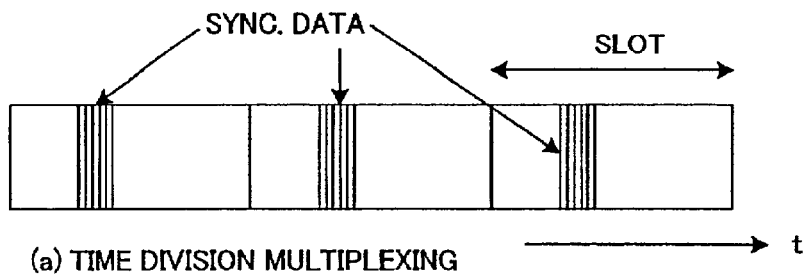
FIGS. 2(a) and 2(b) are views showing the examples of slot configuration of the known data.
Figure 2:
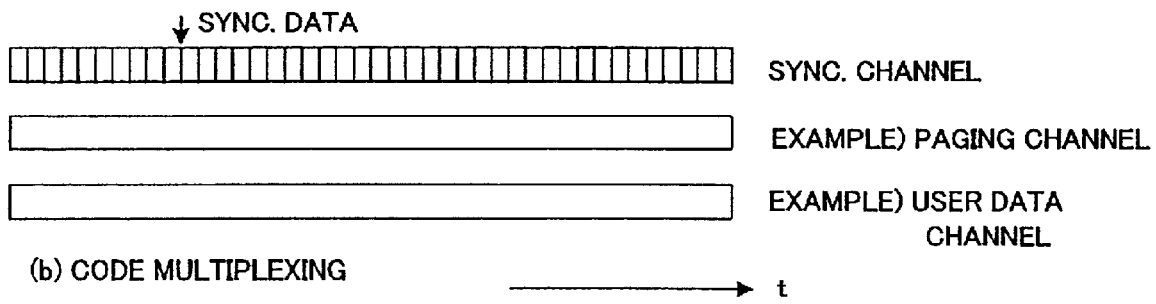

FIGS. 2(a) and 2(b) are views showing the examples of slot configuration of the known data. FIG. 2(a) is a view showing the example in the case of time-division multiplexing communication system. FIG. 2(b) is a view showing the example in the case of code-division multiplexing communication system.

In the case of the time-division multiplexing as in the PDC system, as shown in FIG. 2(a), the known data, i.e., synchronization data, are present periodically in each slot. In the code multiplexing as in the CDMA system, as shown in FIG. 2(b), a synchronization channel is always transmitted, and it is thus possible to make the full slot data to be synchronization data.

The operation of the radio unit will now be described. Radio wave signal received by the antenna 1 is down-converted in the radio unit 2 to an IF signal and then demodulated in the demodulator 3 into a baseband signal. In the case of using orthogonal modulation, the received radio wave signal is distributed to I and Q signals.

The detector circuit 4 samples the amplitudes of the I and Q signals at the timing of the detecting oscillator 9. The frequency error determination circuit 5 converts the amplitude data to frequency data. The conversion may be executed by, for instance, CORDIC method. The frequency data obtained in the frequency error determination circuit 5 is developed in an I-Q coordinate plane as shown in FIG. 3.

Figure 3:
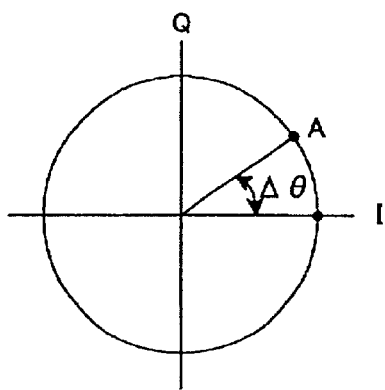
FIG. 3 is a view showing a sampling point expressed in the I-Q coordinate plane.

More specifically, FIG. 3 is a view showing a sampling point expressed in the I-Q coordinate plane. Point A show in FIG. 3 is a sampling point of the frequency data at a clock timing generated in the oscillator 9. The following sampling point is defined as 0° (I=1, Q=0) as will be described hereinunder. When the reference oscillator 7 and the base station are synchronized to each other, the sampling is always executed at 0° point. The angle between the point A and 0° is defined as frequency error $\Delta\theta$.

Figure 4:
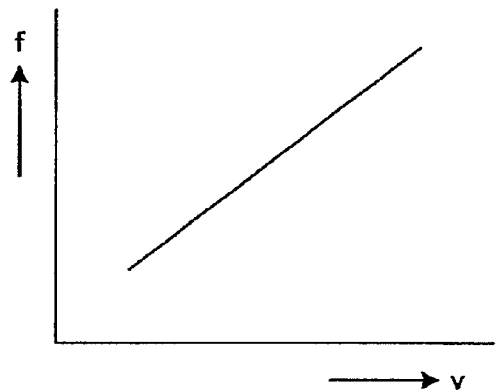
FIG. 4 is a graph showing a control voltage versus oscillation frequency characteristic in the reference oscillation 7 shown in FIG. 1.

FIG. 4 is a graph showing a control voltage versus oscillation frequency characteristic in the reference oscillation 7 shown in FIG. 1.

The oscillation frequency should be increased monotonically with the control voltage. Or the oscillation frequency may be reduced monotonically. The frequency error/control voltage conversion circuit 6 generates the control voltage by computing the control voltage of the reference generator 7 based on the frequency difference $\Delta\theta$ computed in the frequency error determination circuit 5. The control rate of the computed value can be set by the user so that different designs may be made in dependence on systems.

The detection frequency control circuit 8 determines a detection oscillation frequency control value based on the frequency error value of the frequency error determination circuit 5, and transmits the data to the PLL IC 10. The operation of the components 8 to 10 will now be described.

Figure 5:
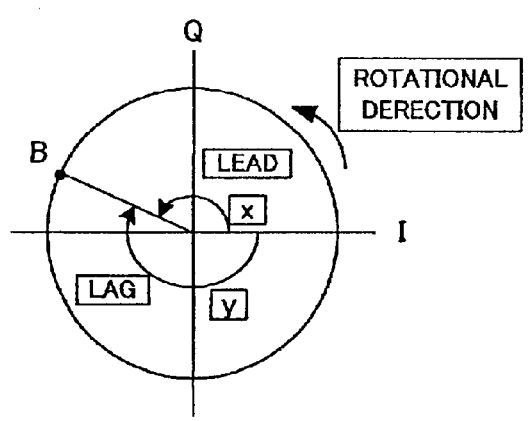
FIGS. 5(a) and 5(b) are a view showing the symbol point in case when the frequency error is large and a view showing the symbol point in case when the clock rate is doubled.
Figure 5:
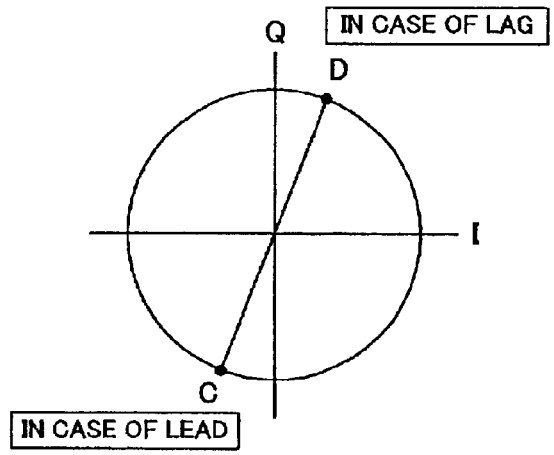

FIGS. 5(a) and 5(b) are views for describing the present invention on the I-Q coordinate plane. FIG. 5(a) is a view showing the symbol point in case when the frequency error is large, and FIG. 5(b) is a view showing the symbol point in case when the clock rate is doubled.

In FIG. 5(a), the frequency error at point B is located in the neighborhood of 180° in the I-Q coordinate plane, and thus it may lead or lag behind the normal symbol A (i.e., symbol point in the case of absence of any frequency error). Therefore, if the determination of the raising or falling edge of the frequency of the reference oscillator 7 is made erroneously, accurate frequency pull-in operation may not be executed. The directions of symbol rotation are shown in FIG. 5(a). A simple example will now be shown, in which the sampling frequency is doubled.

When the point B in FIG. 5(a) is lagging behind, the sampling is made at point D, while when the point B is leading, point C is the sampling point.

EXAMPLE

When the point B corresponds to 170°, it is the case that: point C which is (360+170)/2=265°, is leading, and point D which is 170/2=85°, is lagging behind.

Thus, whether the frequency is lagging behind and leading can be accurately determined. Consequently, it is possible to obtain the frequency pull-in.

Figure 6:
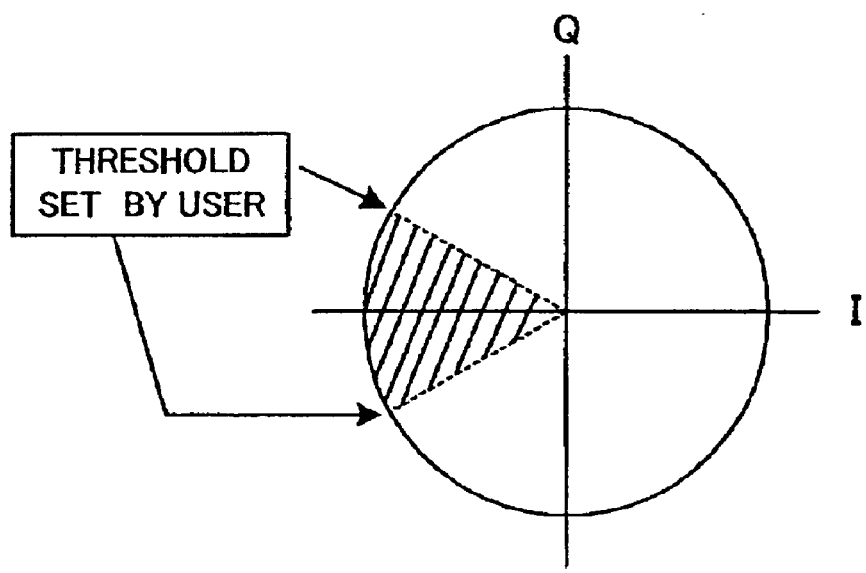
FIG. 6 is a view showing a user setting threshold range for determining the sampling clock variable range.

As shown in FIG. 6, the frequency error threshold for this operation can be set as desired by the user.

FIG. 6 is a view showing a user setting threshold range for determining the sampling clock variable range. When the sampling point is present in the shaded range in FIG. 6, the sampling frequency is changed.

Figure 7:
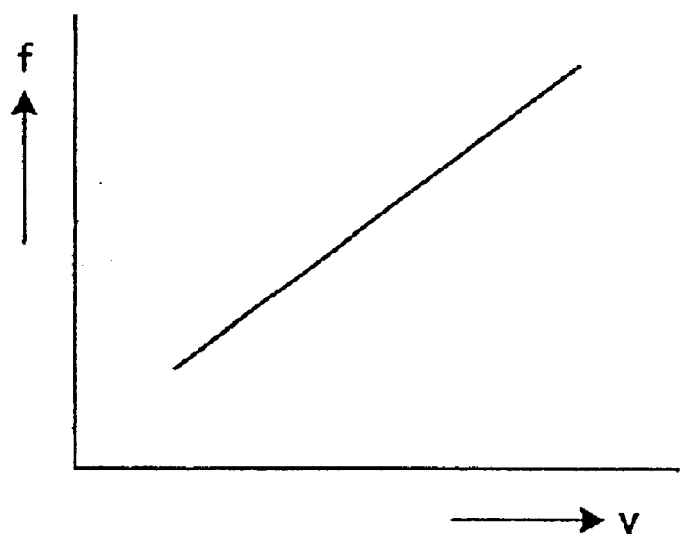
FIG. 7 is a graph showing a control voltage versus oscillation frequency characteristic in the detecting oscillator 9 shown in FIG. 1.

FIG. 7 is a graph showing a control voltage versus oscillation frequency characteristic in the detecting oscillator 9 shown in FIG. 1. As shown in FIG. 7, the oscillation frequency should be changed monotonically with the control voltage. Also, sometimes the oscillation frequency may be reduced monotonically.

In this embodiment, in the radio unit, which has the reference oscillator in the communication system and compensates for frequency error of the reference oscillator by utilizing the radio wave signal from the reference (base) station, a means for computing the frequency error from the detected signal and controlling the reference oscillator based on to the computed frequency error is provided, and it is possible to change the sampling frequency according to the computed frequency error value. The control rate of the frequency error of the reference oscillator can be set as desired by the user.

A different embodiment of the present invention will now be described.

Figure 8:
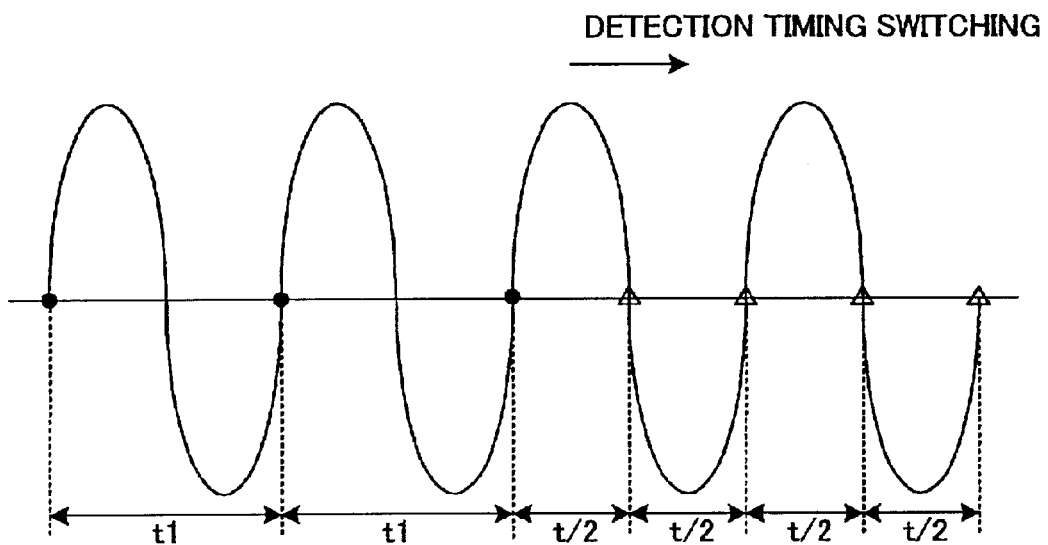
FIG. 8 is a view for describing the detection timing switching.

FIG. 8 is a view for describing the detection timing switching. Simply doubling the detection clock rate, as shown in FIG. 8, can be realized by providing such a switching function that the clock detection in the detector circuit 4 can be made not only by either the rising or falling edge but also by both the edges.

More specifically, in this embodiment it is possible to double the detection rate by switching the detection by only either the rising or falling edge of the detector circuit input clock over to the detection of both the edges for changing the sampling frequency as noted above.

Figure 9:
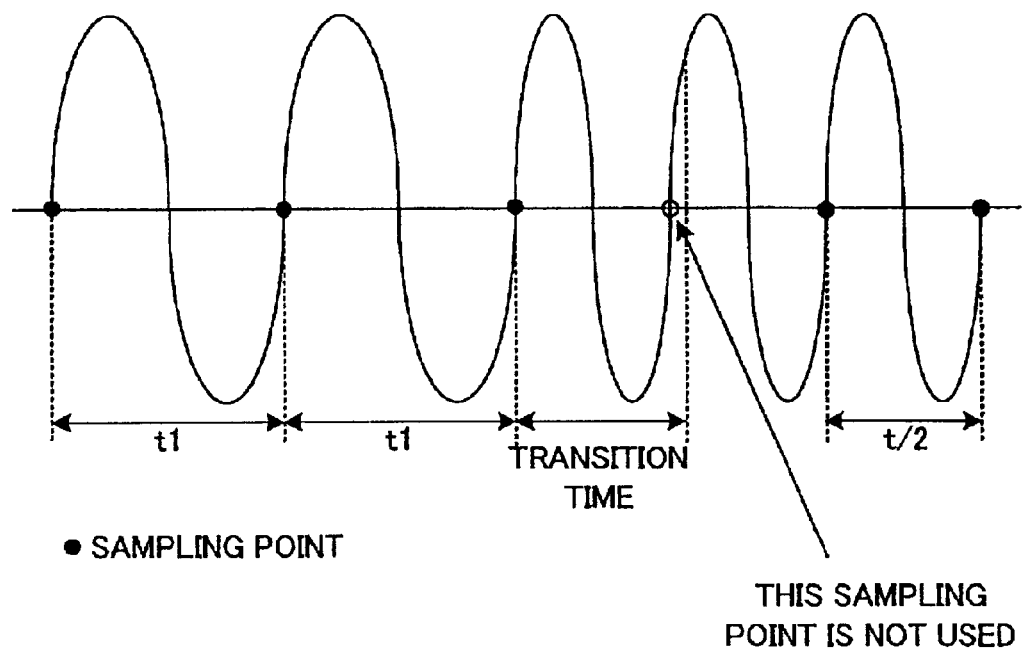
FIG. 9 is a view for describing the detection timing and the clock frequency switching.

FIG. 9 is a view for describing the detection timing and the clock frequency switching. As shown in FIG. 9, changing the frequency of the detecting oscillator 9 requires a certain transition time until the frequency is switched over to the desired frequency. Since the sampling point is unreliable during the transition time, the frequency error should not be calculated from this sampling point for control.

For preventing this, in this embodiment, the control timing circuit 11 computes the transition time based on the variable frequency range, and during this time the control voltage from the frequency error/control voltage conversion circuit 6 is fixed.

In this embodiment, when controlling the detecting oscillator the frequency transition time (i.e., lock time) is preliminarily stored, and no pull-in control is executed during the transmission.

By applying the present invention, it is possible to increase the pull-in frequency range of the AFC circuit and reduce the reference oscillation accuracy and realize reduction of the size and price.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. An AFC circuit for compensating for an error of the oscillation frequency of a detecting oscillator based on a detection signal from a detector circuit, said detector circuit generating said detection signal upon detecting an amplitude of a received signal at a timing tied to the oscillation frequency of said detecting oscillator, said AFC circuit comprising:

a frequency error determining circuit for converting the detection signal amplitude to a frequency error value;

a reference oscillator;

a frequency error/control voltage conversion circuit connected to receive the frequency error value from said frequency error determining circuit and connected to feed a control voltage signal to said reference oscillator;

a PLL (phase lock loop) circuit;

a detecting frequency computing circuit connected to receive the frequency error value from said frequency error determining circuit and connected to feed a detection oscillation frequency control value to said PLL circuit;

said reference oscillator connected to provide an oscillator input to said PLL;

said PLL connected to provide a control voltage to said detecting oscillator, said detecting oscillator responsive to said control voltage for controlling the oscillation frequency thereof;

wherein said AFC circuit controls the oscillation frequency of the detecting oscillator based on the frequency error value so as to vary the oscillation frequency used as a sampling frequency of the detector circuit.

2. The AFC circuit according to claim 1, wherein the received signal is modulated in an orthogonal system capable of performing development to an I-Q coordinate plane, the frequency error value being computed from the amplitudes of I and Q signals.

3. The AFC circuit according to claim 1, wherein the detector circuit is operative to double the detection rate by switching operation thereof from sampling said received signal using only either the rising or falling edge of the oscillation frequency of said detecting oscillator over to sampling said received signal using both the rising and falling edges of the oscillation frequency of the detecting oscillator.

4. The AFC circuit according to claim 1, wherein the rate of control of the error of the oscillation frequency for the detecting oscillator is capable of being set by a user.

5. The AFC circuit according to claim 1, wherein a frequency error threshold can be set by a user by determining whether or not to change the sampling frequency of the detector circuit by checking whether the frequency error value is greater than a predetermined frequency error threshold.

6. The AFC circuit according to claim 1, wherein for controlling the detecting oscillator a frequency transition time is preliminarily stored, and no pull-in control is made during the transition time.

7. An AFC method for compensating for an error of the oscillation frequency of a detecting oscillator based on a detection signal from a detector circuit, said detector circuit generating said detection signal upon detecting a received signal at a timing tied to the oscillation frequency of said detecting oscillator, said AFC method comprising:

converting the received signal to a frequency error value;

providing a reference oscillator;

converting the frequency error value to a control voltage signal;

providing a PLL (phase lock loop) circuit;

providing a detection oscillation frequency control value to said PLL circuit and said reference oscillator in response to said frequency error value;

feeding an output of said reference oscillator to said PLL;

providing, using said PLL, a control voltage to said detecting oscillator, controlling the oscillation frequency of said detecting oscillator in response to said control voltage;

wherein said AFC circuit controls the oscillation frequency of the detecting oscillator based on the frequency error value so as to vary the oscillation frequency used as a sampling frequency of the detector circuit.

* * * * *